(12) United States Patent
Ryu et al.

(10) Patent No.: US 12,136,940 B2
(45) Date of Patent: Nov. 5, 2024

(54) MOBILE DEVICE CASE AND COATING METHOD THEREOF

(71) Applicant: IMTECHNOLOGY.CO., LTD, Seongnam-si (KR)

(72) Inventors: Seung Kyun Ryu, Seoul (KR); Sook Eun Baek, Seoul (KR)

(73) Assignee: IMTECHNOLOGY.CO., LTD, Seongnam-si (KR)

( * ) Notice: Subject to any disclaimer, the term of this patent is extended or adjusted under 35 U.S.C. 154(b) by 825 days.

(21) Appl. No.: 17/253,489

(22) PCT Filed: Jan. 8, 2019

(86) PCT No.: PCT/KR2019/000284
§ 371 (c)(1),
(2) Date: Dec. 17, 2020

(87) PCT Pub. No.: WO2020/145423
PCT Pub. Date: Jul. 16, 2020

(65) Prior Publication Data
US 2021/0266026 A1 Aug. 26, 2021

(30) Foreign Application Priority Data
Jan. 8, 2019 (KR) .......................... 10-2019-0002282

(51) Int. Cl.
  H05K 5/04        (2006.01)
  C23C 18/31       (2006.01)
  H04B 1/3888      (2015.01)
  H05K 5/00        (2006.01)

(52) U.S. Cl.
  CPC ........... *H04B 1/3888* (2013.01); *C23C 18/31* (2013.01); *H05K 5/0086* (2013.01); *H05K 5/04* (2013.01)

(58) Field of Classification Search
  CPC ... C23C 18/31; C23C 18/1806; H04B 1/3888; H05K 5/0086; H05K 5/04
  USPC ............................................ 455/575.1–575.9
  See application file for complete search history.

(56) References Cited

U.S. PATENT DOCUMENTS

| | | | |
|---|---|---|---|
| 2009/0151516 A1* | 6/2009 | Su ...................... | H05K 7/1417 361/752 |
| 2015/0311942 A1* | 10/2015 | Leem .................. | H04B 5/0031 455/41.1 |
| 2018/0305834 A1* | 10/2018 | Brockmann ........ | C25D 5/48 |

FOREIGN PATENT DOCUMENTS

| EP | 3518510 A1 * | 7/2019 | .......... H04M 1/0202 |
|---|---|---|---|
| KR | 10-2004-0078993 A | 9/2004 | |
| KR | 10-2005-0120435 A | 12/2005 | |
| KR | 10-2009-0103949 A | 10/2009 | |

(Continued)

*Primary Examiner* — Jinsong Hu
*Assistant Examiner* — Farideh Madani
(74) *Attorney, Agent, or Firm* — Bridgeway IP Law Group, PLLC; Jihun Kim (57) ABSTRACT

Proposed is a mobile device case that accommodates or covers a substrate and an electronic element located on the substrate. The case includes: a case frame made of a high molecular material including a resin and having a cover part for accommodating or covering the substrate and protrusions protruding from the cover part in such a manner as to be extended close to the electronic element; and a metal coating layer formed by coating a metal on a surface of the case frame including the protrusions to improve electromagnetic shielding ability.

2 Claims, 7 Drawing Sheets

(56) References Cited

FOREIGN PATENT DOCUMENTS

| KR | 10-2019-0000953 A | 1/2019 |
|---|---|---|
| WO | 2017-135667 A1 | 8/2017 |

\* cited by examiner

MOBILE DEVICE CASE AND COATING METHOD THEREOF

TECHNICAL FIELD

The present invention relates to a mobile device case and a coating method thereof, and more particularly, to a mobile device case like a cellular phone, a communication device, and so on, that is lightweight and has high strength and improved electromagnetic shielding ability, and to a method for coating the mobile device case.

BACKGROUND ART

Recently, a mobile device has had various functions, and the performance of the mobile device has been enhanced, so that the size of a display for displaying such various functions becomes large.

So as to handle and display various functions required by consumers, in specific, a high performance and a high resolution display is mounted on a cellular phone, a game machine, an information communication processing device, and so on, which has become a trend in most of device manufacturing companies as well as leading companies.

In the past, a plastic housing (See FIG. 1a) made of polycarbonate is widely used as a housing of a smartphone functioning as a case for fixing a display of the smartphone and covering the parts of the smartphone. Recently, however, a smartphone housing (See FIG. 1b) made of high strength aluminum has been widely used to fix a display larger than 5 inches.

However, the aluminum housing like the smartphone case is made one by one through computer numerical control (CNC) machining, thereby disadvantageously causing extremely low productivity and high production cost.

In spite of such disadvantages, however, the leading smartphone manufacturing companies consistently make and release the aluminum housings on the market, thereby making consumers feel the aluminum housings are high end products. Contrarily, the smartphone housing made of the plastic is recognized as a low end product, so that the plastic housing has not been widely used anymore.

The representative aluminum metal housing is made by machining an aluminum ingot through milling and CNC machining. Most of the smartphone manufacturing companies make use of the metal housing manufactured by their outsourcing vendors.

It is known that the largest smartphone manufacturing company in Korea which had built a factory in Vietnam consumes about 40 minutes so as to manufacture one metal housing. So as to make a large number of metal housings, particularly, a large number of machining devices are installed or a large number of outsourcing companies are necessarily required.

So as to make a new product, further, it is known that the leading companies have to hold tens of thousands of CNC machines several months prior to thus make a very large number of housings in advance before the new product is announced, so that they have had many difficulties in making the new product. As mentioned above, besides, the productivity of the metal housing is low.

A coating method for electromagnetic shielding in conventional electronic devices is classified into a vacuum metalizing process in which a metal is deposited on an object to be coated in a vacuum state, a conductive paint spray in which a liquid containing metal powder is sprayed onto an object to be coated, and electroless plating in which an object to be coated is put in a plating bath and is thus plated. At present, the conductive paint spray method is generally used in the domestic manufacturing companies, and the electroless plating using a polymer alloy as a material is used in some of foreign companies like Nokia.

The vacuum metalizing process among them is widely used at an initial production stage of the smartphone, which causes low productivity, high manufacturing cost, and low adhesion with a material, so that the vacuum metalizing process is rarely used at present. Accordingly, the conductive paint spray and the electroless plating are generally used.

In many domestic companies, a silver or copper conductive paint is currently used, which is imported chiefly from the United States. The conductive paint spray has little influence on a material and provides good adhesion, but the silver conductive paint makes use of an organic solvent, thereby undesirably emitting air pollutants while being dried and raising the manufacturing cost.

DISCLOSURE

Technical Problem

Accordingly, the present invention has been made to solve the above-mentioned problems, and it is an object of the present invention to provide a mobile device case that is capable of being located at the inside and outside of the mobile device like a cellular phone or communication device, while providing both of advantages of a plastic and advantages of a metal, so that the case is lightweight and has high strength, improved electromagnetic shielding ability, and unique colors, and to provide a method for coating the mobile device case.

The technical problems to be achieved through the present invention are not limited as mentioned above, and other technical problems not mentioned herein will be obviously understood by one of ordinary skill in the art through the following description.

Technical Solution

To accomplish the above-mentioned objects, according to one aspect of the present invention, there is provided a mobile device case for accommodating or covering a substrate and an electronic element located on the substrate, the mobile device case including: a case frame made of a high molecular material including a resin and having a cover part for accommodating or covering the substrate and protrusions protruding from the cover part in such a manner as to be extended close to the electronic element; and a metal coating layer formed by coating a metal on a surface of the case frame including the protrusions to improve electromagnetic shielding ability.

According to the present invention, the metal coating layer contains any one of copper, silver, nickel, chrome, cobalt, and a compound thereof and has a thickness in the range of 5 to 100 μm.

According to an embodiment of the present invention, the mobile device case further includes an antenna protection area located around an antenna of the mobile device to protect the antenna, so that the metal coating layer is not formed on the antenna protection area to allow radio waves to be transmitted and received to and from the antenna.

To accomplish the above-mentioned objects, according to another aspect of the present invention, there is provided a method for coating a mobile device case for accommodating or covering a substrate and an electronic element located on the substrate, the method including the steps of: providing a case frame made of a high molecular material including a resin and having a cover part for accommodating or covering the substrate and protrusions protruding from the cover part in such a manner as to be extended close to the electronic element; allowing the case frame to be subjected to hot air drying to remove a cleaning agent and water from the surface of the case frame; allowing the surface of the case frame dried with hot air to be subjected to a cold plasma treatment to introduce polar functional groups so that it is possible to perform plating on the surface of the case frame; allowing the surface of the case frame to be subjected to a catalystic treatment and an activation treatment for post-processes; and forming a metal coating layer on the surface of the case frame by means of electroless plating.

According to the present invention, the method further includes, after the step of forming the metal coating layer, the step of heating the case frame to a temperature less than a softening point of the high polymer material for 5 to 200 minutes to remove gas so that an adhesive force between the case frame and the metal coating layer is improved.

Advantageous Effects

According to the present invention, the mobile device case is adapted to cover the inside and outside of the mobile device like the cellular phone or communication device, while providing both of the advantages of the plastic and the advantages of the metal, so that the mobile device case is lightweight and has high strength, improved electromagnetic shielding ability, and unique colors.

The effects of the invention are not limited as mentioned above, and it should be understood that the effects of the invention include all effects inferable from the detailed description and claims of the present invention.

BRIEF DESCRIPTION OF DRAWINGS

FIGS. 5a to 6b are photographs showing case products used to measure the electromagnetic shielding ability.

BEST MODE FOR INVENTION

Hereinafter, the present invention will now be described in detail with reference to the attached drawings. Before the present invention is disclosed and described, the disclosed embodiments are merely exemplary of the invention, and the present invention is not limited thereto. The corresponding parts in the drawings are indicated by corresponding reference numerals.

In the description, when it is said that one element is described as being "connected" or "coupled" to the other element, one element may be directly connected or coupled to the other element, but it should be understood that another element may be present between the two elements. When it is said that one portion is described as "includes" any component, further, one element further may include other components unless no specific description is suggested.

Terms used in this application are used to only describe specific exemplary embodiments and are not intended to restrict the present invention. An expression referencing a singular value additionally refers to a corresponding expression of the plural number, unless explicitly limited otherwise by the context. In this application, terms, such as "comprise", "include", or "have", are intended to designate those characteristics, numbers, steps, operations, elements, or parts which are described in the specification, or any combination of them that exist, and it should be understood that they do not preclude the possibility of the existence or possible addition of one or more additional characteristics, numbers, steps, operations, elements, or parts, or combinations thereof.

Now, an explanation on the present invention will now be given in detail with reference to the attached drawings.

Figure 1A:
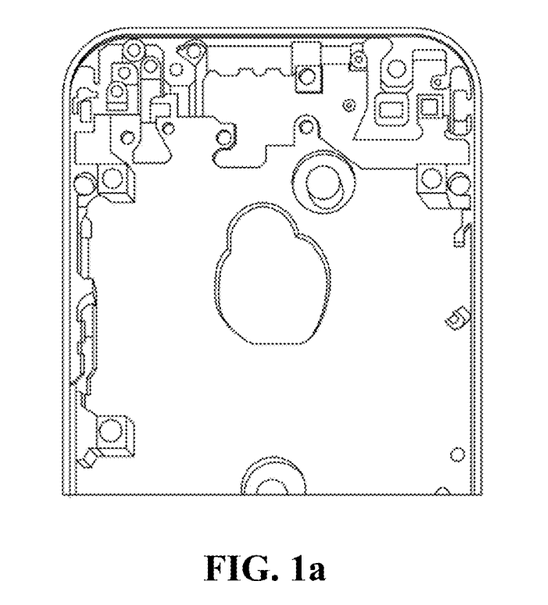
FIGS. 1a and 1b are photographs showing a mobile device case which is made of aluminum through CNC machining and a mobile device case which is made of plastic through injection molding.
Figure 1B:
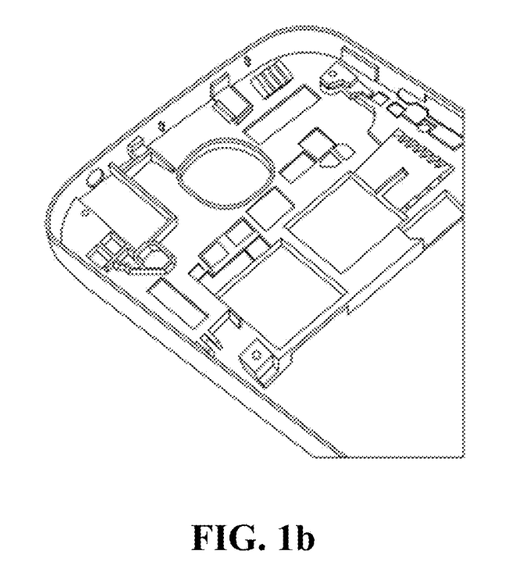

FIGS. 1a and 1b are photographs showing a mobile device case which is made of aluminum through CNC machining and a mobile device case which is made of plastic through injection molding.

Aluminum is restricted according to shapes and sizes of machining tools during CNC machining, so that there is a limitation to micromachining. However, plastic is subjected to injection molding in a state of being semi-melted, so that even minute portions, which cannot be made by means of the CNC machining, can be molded.

Figure 2:
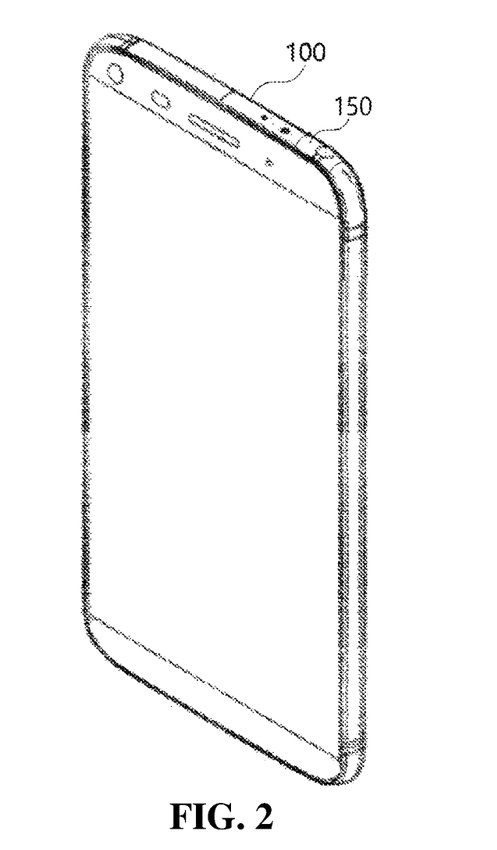
FIG. 2 is a perspective view showing a mobile device case according to the present invention.
Figure 3A:
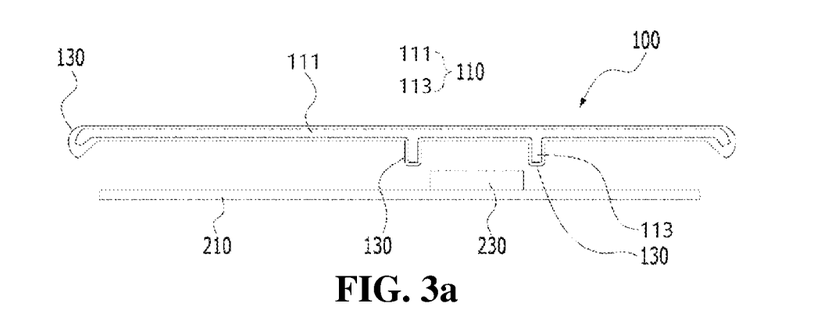
FIGS. 3a and 3b are sectional views showing the mobile device case according to the present invention.
Figure 3B:
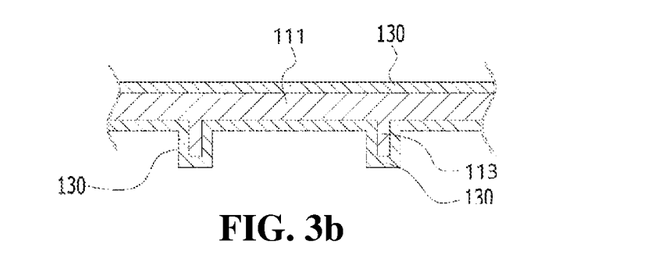

FIG. 2 is a perspective view showing a mobile device case 100 according to the present invention. FIGS. 3a and 3b are sectional views showing the mobile device case 100 according to the present invention.

The mobile device case 100 according to the present invention means both of a protection case used for edges of the mobile device like a smartphone, a tablet PC, and so on and a housing for covering and protecting internal parts of the mobile device.

The mobile device case 100 (hereinafter referred to as "case") according to the present invention accommodates or covers a substrate 210 and an electronic element 230 located on the substrate 210. In this case, the case 100 is coupled to a display of the mobile device, while placing the substrate 210 therebetween.

The case 100 includes a case frame 110 and a metal coating layer 130 applied to the case frame 110.

The case frame 110 is made of a high molecular material including a resin. The case frame 110 includes a cover part 111 for accommodating or covering the substrate 210 and protrusions 113 protruding from the cover part 111 in such a manner as to be extended close to the electronic element 230.

The protrusions 113 are located around the electronic element 230 requiring electromagnetic shielding, as shown in FIGS. 3a and 3b, and otherwise, they may surround or come into close contact with the electronic element 230. The protrusions 113 are unitarily formed with the case frame 110, and after the case frame 110 has been made, otherwise, the protrusions 113 may be attached additionally to the case frame 110. Further, the protrusions 113 may be formed by means of machining through which the case frame 110 is changed in shape.

The metal coating layer 130 is formed by coating a metal on the surface of the case frame 110 including the protrusions 113. The metal coating layer 130 contains any one of copper, silver, nickel, chrome, cobalt, and a compound thereof and has a thickness in the range of 5 to 100 μm.

The metal coating layer 130 is formed on the entire surface of the case 100 or on the entire surface of the case 100 except a portion thereof.

As the case 100 includes the case frame 110 made of the high molecular material including the resin, the case 100 has various advantages the high molecular material has.

The high molecular material including a polymer is composed of organic molecules synthesized into long chains. High molecular weight and molecular bonds of the polymer generate inherent characteristics. Such inherent characteristics include toughness, elasticity, low density, high melting point and low melting point, molding capability, electrical resistance, and many different characteristics in very wide range.

In specific, the molding capability of the high molecular material is excellent, and the metal coating layer 130 is formed in mass at once. When compared with a method for producing the aluminum case one by one through the CNC machining of an aluminum block, the case 100 is produced with higher productivity.

Through the formation of the metal coating layer 130, further, the case 100 can be remarkably improved in strength, durability, and particularly the electromagnetic shielding ability. Also, the metal coating layer 130 has an inherent metal color, which enables various selection in design.

If necessary, in addition, different kinds of metal coating layers 130 are laid on top of each other, thereby improving the electromagnetic shielding ability and the mechanical properties.

Figure 4:
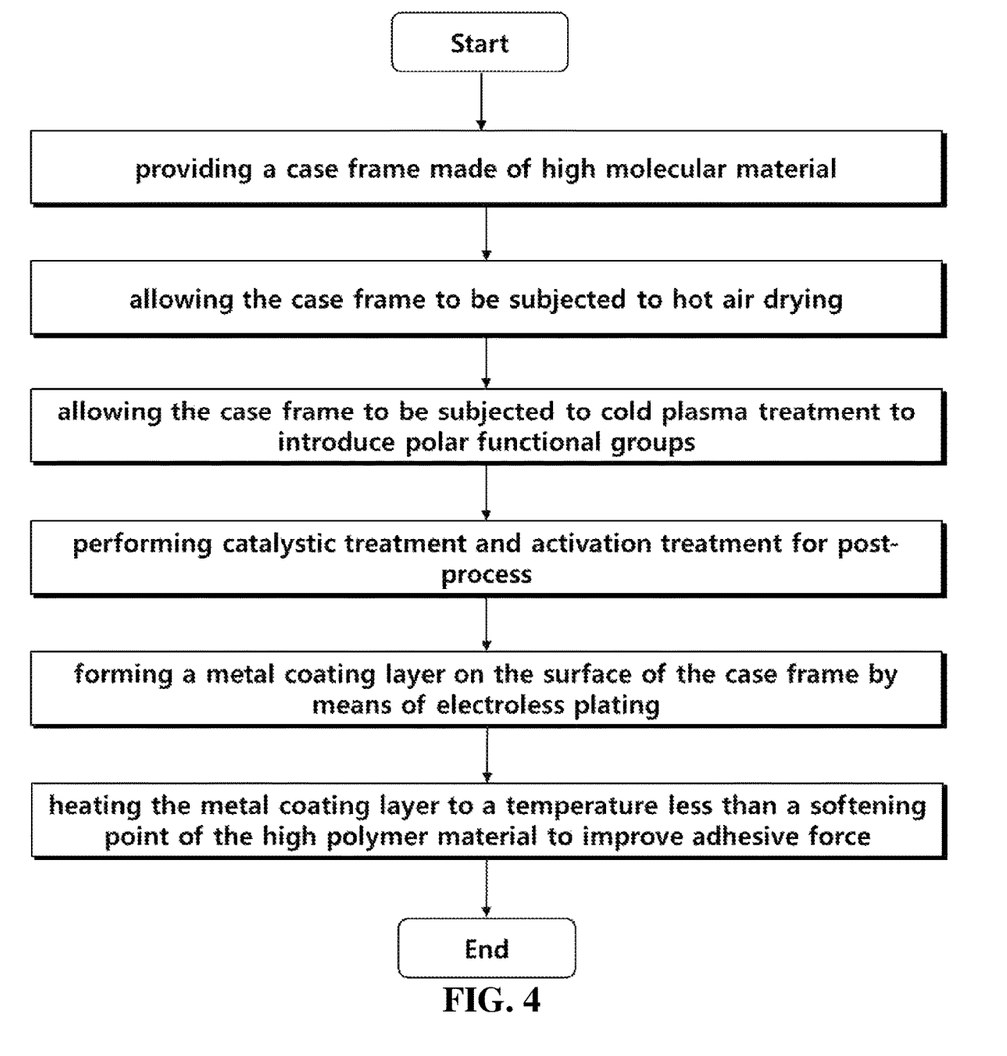
FIG. 4 is a flowchart showing a method for coating the mobile device case according to the present invention.

Table 1 shows comparison results of various electromagnetic shielding methods.

part 111 for accommodating or covering the substrate 210 and the protrusions 113 protruding from the cover part 111 in such a manner as to be extended close to the electronic element 230 (at step S10).

Next, the method for coating the mobile device case 100 includes the step of allowing the case frame 110 to be subjected to hot air drying to remove a cleaning agent and water from the surface of the case frame 110 (at step S20).

Next, the method for coating the mobile device case 100 includes the step of allowing the surface of the case frame 110 dried with hot air to be subjected to a cold plasma treatment to introduce polar functional groups so that it is possible to perform plating on the surface of the case frame 110 (at step S30).

After that, the method for coating the mobile device case 100 includes the step of allowing the surface of the case frame 110 to be subjected to a catalystic treatment and an activation treatment for post-processes (at step S40).

Next, the method for coating the mobile device case 100 includes the step of forming a metal on the surface of the case frame 110 by means of electroless plating to thus form the metal coating layer 130 (at step S50).

After the metal coating layer 130 has been formed, the method for coating the mobile device case 100 includes the step of heating the case frame 110 to a temperature less than a softening point of the high polymer material for 5 to 200 minutes to remove gas so that an adhesive force between the high polymer material and the metal coating layer 130 is improved (at step S60).

Referring to FIGS. 3a to 4, hereinafter, the respective steps will be more specifically explained.

In the method for coating the mobile device case 100, first, the case frame 110 is provided (at the step S10). The

TABLE 1

Effectiveness results of various electromagnetic shielding methods

| Coating method | Coating material | Shielding effectiveness (dB) | Contact charging | Concave convex uniformity | Thickness shielding effectiveness | Thickness uniformity | Corrosion resistance Durability | Adhesion |
|---|---|---|---|---|---|---|---|---|
| Electroless plating | CuNi | 80-110 | ○ | ◎ | ◎ | ◎ | ◎ | ○ |
| Vacuum plating | Al | 60-80 | Δ | Δ | Δ | Δ | ○ | Δ |
| Conductive paint spray | Ni | 40-60 | X | Δ | Δ | Δ | ○ | ○ |
| | Cu | 50-70 | Δ | Δ | Δ | Δ | Δ | ○ |
| | Ag | 70-80 | Δ | Δ | Δ | Δ | Δ | ○ |

(wherein a symbol ◎ indicates very good, ○ good, Δ available, and X not available)

Referring to Table 1, the electroless plating has the highest electromagnetic shielding effectiveness among all of the methods, so that it is possible to shield the electromagnetic waves through the coating layer with a low thickness. A typical thickness of a coating layer required to shield the electromagnetic waves is in the range from 2 to 2.5 μm in the electroless plating and in the range from 50 to 75 μm in the conductive paint spray.

FIG. 4 is a flowchart showing a method for coating the mobile device case according to the present invention.

A method for coating the mobile device case 100 adapted to accommodate or cover the substrate 210 and the electronic element 230 located on the substrate 210 includes the step of providing the case frame 110 made of a high molecular material including a resin and having the cover case frame 110 is a frame with the shape capable of being coupled to a display of the mobile device, as shown in FIGS. 2a to 3a.

The case frame 110 is made of the high molecular material including the resin or polymer and has the cover part 111 for accommodating or covering the substrate 210 and the protrusions 113 protruding from the cover part 111 in such a manner as to be extended close to the electronic element 230. The case frame 110 is made of a resin or plastic by means of injection molding, 3D printing, and so on.

The protrusions 113 are unitarily formed with the case frame 110, and after the case frame 110 has been made, otherwise, the protrusions 113 may be attached additionally to the case frame 110. Further, the protrusions 113 may be formed by means of machining through which the case frame 110 is changed in shape.

Next, check-up and cleaning are carried out. For example, after defects on the outer shape of the case frame 110 are checked, contaminants like fingerprint, dust, organic matters, and so on are checked with the naked eye, and ultrasonic cleaning is carried out through an ultrasonic cleaner.

After that, the hot air drying is carried out (at the step S20). For example, the cleaning agent is removed from the surface of the case frame 110 in an oven by means of hot air, and the water absorbed to the surface of the case frame 110 during the cleaning process is removed, thereby preventing a pressure in the post processes from being decreased due to existence of water and gas.

After the hot air drying, next, the case frame 110 is subjected to the cold plasma treatment to introduce the polar functional groups (at the step S30). For example, after the case frame 110 is put into a vacuum chamber, hydrophilic functional groups are introduced into the surface of the case frame 110 by means of the cold plasma treatment so that the case frame 110 is changed to a structure in which plating is possible.

Through the cold plasma treatment, a contacting angle of the surface of the case frame 110 with respect to $H_2O$ becomes substantially small, desirably kept at an angle of 10~50°, so that the metal plating effectiveness in the post process can be improved.

Even if the high polymer material is treated with ion beam like hydrogen in reactive gas like oxygen, the polar functional groups can be produced on the surface of the high polymer material, but as the treatment has to be controlled under high vacuum, a treatment cost is undesirably expensive. Accordingly, if the cold plasma treatment that is controlled under low vacuum of about 10 Torr is applied, the polar functional groups can be produced on the surface of the high polymer material with a substantially low treatment cost.

If a material with oxygen like acetone or acetic acid for expressing polar groups is activated by a plasma and then reacts to the high molecular material like PE or PP, the polar functional groups like C=O or O—H are produced on the surface of the high molecular material. The production of the polar functional groups can be checked by measuring the contact angle of the surface of the case frame 110 with respect to $H_2O$ or by detecting hydroxyl groups or carbonyl groups through an infrared absorption spectroscope. Further, a treatment time and control conditions of a plasma generating device are controlled to adjust degrees of functional groups generated according to a kind of metal to be plated or a required film thickness.

The high molecular materials commonly referred to as plastics have differences according to elements of monomers, but generally, the high molecular materials are strong hydrophobic materials. All of PEEK, PPS, polycarbonate (PC), Teflon (PTFE), epoxy resin, and so on, which are widely used in mechanical parts, are hydrophobic.

The high molecular material does not transmit electricity and is very stable so that it cannot be easily oxidized and reduced, and through electroplating or general electroless plating as a chemical reduction method, accordingly, it is impossible to form the metal film on the surface of the case frame 110. However, if the functional groups capable of accumulating metal ions on the surface of the high molecular material are large, it is possible to form the metal film on the surface of the case frame 110 through the electroless plating using a reducing agent.

For example, in the plasma treatment for treating the surface of the case frame 110 to from the metal coating layer 130 as will be discussed later on the surface of the case frame 110, a temperature of the case frame 110 to be treated by means of cold plasma is less than a glass transition point, and desirably, in a state where a temperature in the vacuum vessel is less than 50° C., the plasma treatment is carried out.

Further, desirably, one or more elements selected from the group consisting of low density air, acetone, water, acetaldehyde, formalin, acrylic acid, oxygen, nitrogen, argon, and hydrogen are mixed to generate the plasma.

In the application of the electroless plating after the cold plasma treatment according to the present invention, the case frame 110 to which the electroless plating is applied makes use of PEEK, PPS (polyphenylene sulfide), PTFE (polytetrafluoroethylene), PI (polyimide), epoxy resin, and a mixture by mixing the PEEK, PPS, PTFE, PI, or epoxy resin and organic or non-organic matters like carbon fibers, glass fibers, alumina, and so on, and a noble metal catalyst is desirably palladium.

As mentioned above, in the plating method according to the present invention, basically, the hydrophilic functional groups are generated on the surface of the case frame 110 by means of the cold plasma containing reactive gas or by means of the ion implantation, and next, the noble metal catalyst is absorbed to the surface of the polarized case frame 110. In a state where the metal ions to be plated are condensed, the metal is precipitated by means of the reducing agent, without transmitting electricity, to make the metal film.

After the cold plasma treatment, next, the catalyst process and the activation process are carried out (at the step S40). For example, the case frame 110 after the plasma treatment is submerged into a mixed liquid made by mixing a catalyst-imparting liquid (e.g., 0.1~100 g/C of palladium chloride ($PdCl_2$)) and 0.1~100 g/l of tin (II) chloride ($SnCl_2$) for five minutes. After that, the activation process is carried out. For example, the case frame 110 after the catalyst process is subjected to the activation process in 50~60% hydrochloric acid solution at a temperature of 15~50° C. for three minutes and is subjected to washing three times.

In the electroless plating, heating is carried out to activate the reducing agent, but since it is hard to heat the high molecular material, as mentioned above, the catalyst can be used. The palladium ions are easily reduced to the metal state by means of the reducing agent to advantageously provide activated hydrogen required for the reduction of the thin film type material like copper. Tin (Sn) added to expose the palladium ions well is cleaned with weak acidic liquid (the hydrochloric acid solution as mentioned above) and is thus removed.

More desirably, the hydrophilic functional groups are introduced onto the surface of the case frame 110 by means of the cold plasma treatment, and after the case frame 110 is submerged into the catalyst, it is washed with the hydrochloric acid. After that, further, the case frame 110 is cleaned by means of a cleaning agent or an ultrasonic cleaner. Through the addition of the cleaning, the hydrophilic functional groups introduced onto the surface of the case frame 110 can be arranged, and accordingly, the metal coating layer plating effectiveness can be more improved in the post processes.

Subsequently, the metal coating layer 130 is formed by means of the electroless plating (at the step S50).

In case of copper plating, for example, the case frame 110 after the activation process is submerged into an electroless copper plating liquid in which copper sulfate, formalin, caustic soda, EDTA, sodium bicarbonate, and so on are mixed for 60 minutes to thus perform the plating, and next, the plated case frame 110 is washed three times to form the metal coating layer 130 made of the copper on the surface thereof.

Otherwise, the case frame 110 is submerged into an aqueous solution containing 20~150 ml/l sulfuric acid or hydrochloric acid at a temperature of 15~40° C. for 1 to 15 minutes to thus perform the electroless plating.

As shown in FIGS. 3a and 3b, metal coating for both of the cover part 111 and the protrusions 113 of the case frame 110 can be carried out. The plated metal coating layer 130 is selected from a copper film, a nickel film, a chrome film, a noble metal film containing gold or silver, an alloy film thereof, and a composite material film.

So as to prevent the metal coating layer 130 from having an influence on transmitting and receiving radio waves to and from an antenna of the mobile device, on the other hand, a given area of the case frame 110 around the antenna is defined as an antenna protection area 150 (See FIG. 2), and accordingly, the metal coating layer 130 is not formed on the protection area 150.

The metal coating layer 130 has more excellent electromagnetic shielding performance than a light metal like aluminum.

After the metal coating layer 130 has been plated, according to the present invention, the process of improving adhesive force is carried out (at the step S60).

For example, the case frame 110 is heated to a temperature less than a softening point of the high polymer material as a material thereof for 5 to 200 minutes. Through the heating process, the adhesive force between the case frame 110 and the metal coating layer 130 can be improved.

The case 100 with the case frame 110 covered with the metal coating layer 130 according to the present invention improves the mechanical performance and reduces the weight. That is, the case 100 provides high strength compared with a weight. Also, as mentioned above, the case 100 remarkably improves the electromagnetic shielding performance.

On the other hand, the properties of a material are greatly influenced by the kinds and properties of the metal plated on the outermost surface of the material, and accordingly, metals having different properties, alloys containing the metals, or metal composite materials can be formed according to purposes. That is, only the metal coating layer 130 is used to provide necessary functions, and otherwise, secondary and tertiary plating are carried out to provide additional functions. In the post plating like the secondary and tertiary plating, a wet electric plating solution is used to allow a metal layer adequate to the use purpose to be plated on the outermost surface of the case frame 110.

For example, a high density and high corrosion resistant metal like nickel or chrome is further plated as the outermost surface layer on the surface of the metal coating layer 130, and otherwise, a metal plating liquid having a specially made color is formed as the outermost surface layer.

Through the process, the case 100 of the mobile device can have the high density copper layer with a thickness of about 8 μm or more as the metal coating layer 130.

FIGS. 5a to 6b are photographs showing case products used to measure the electromagnetic shielding ability. FIGS. 7a and 7b are side views showing a method for measuring the electromagnetic shielding ability.

Figure 5A:
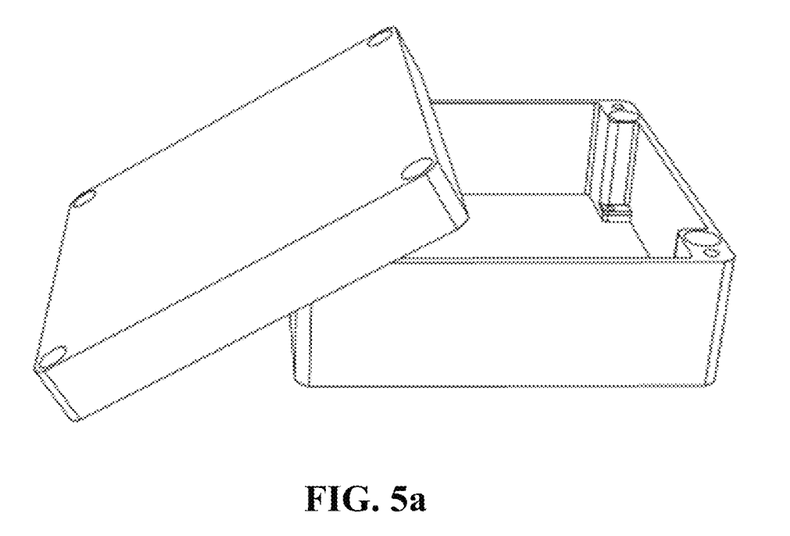
Figure 5B:
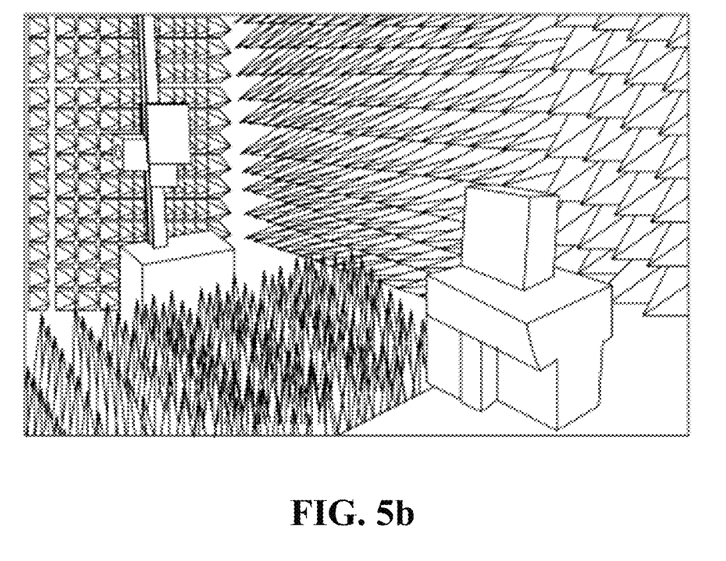

As shown in FIGS. 5a and 5b, the electromagnetic shielding ability for the case (upper photograph) having the metal coating layer 130 formed on the surface of the case frame 110 made of plastic is measured in a measurement laboratory (lower photograph).

Figure 6A:
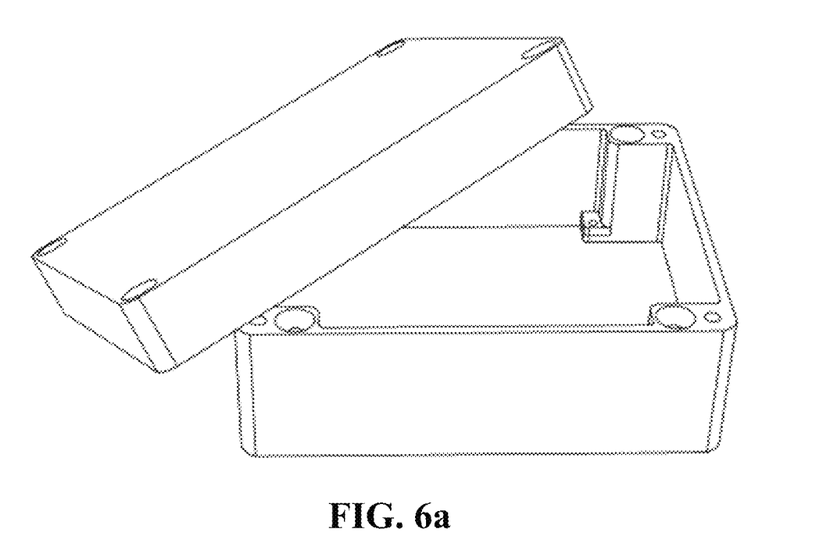
Figure 6B:
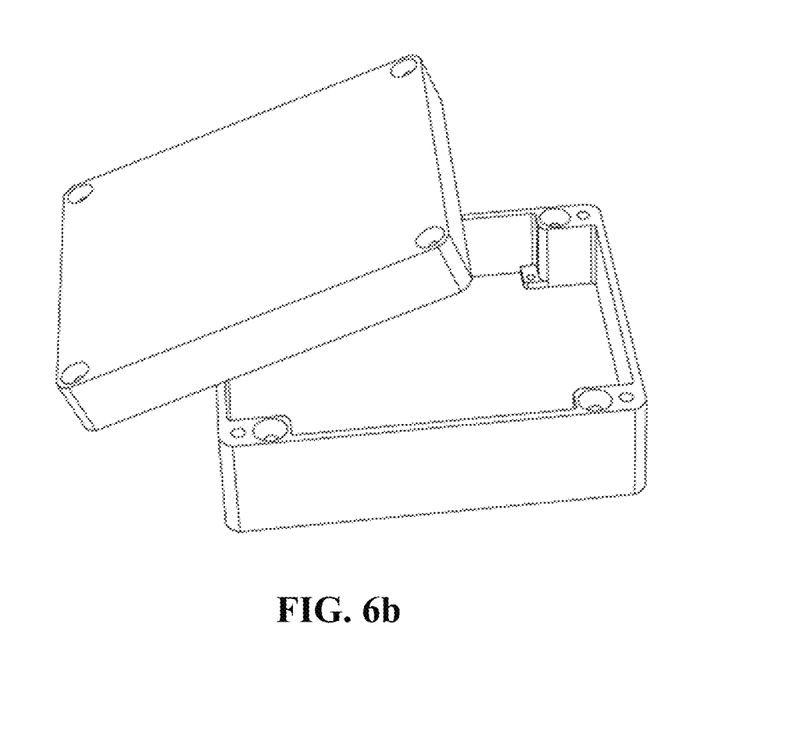
Figure 7A:
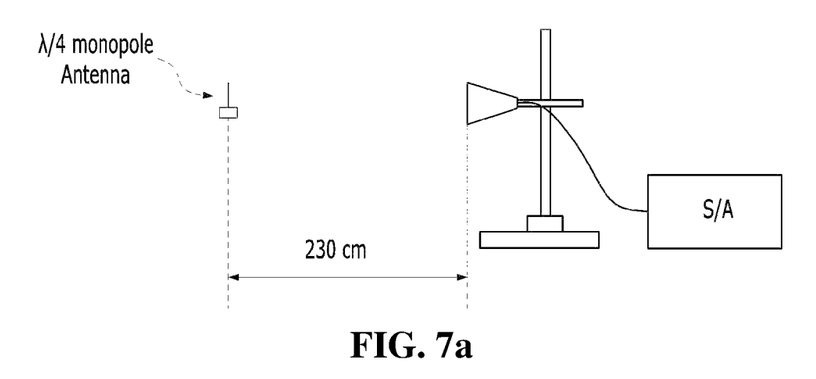
FIGS. 7a and 7b are side views showing a method for measuring the electromagnetic shielding ability.
Figure 7B:
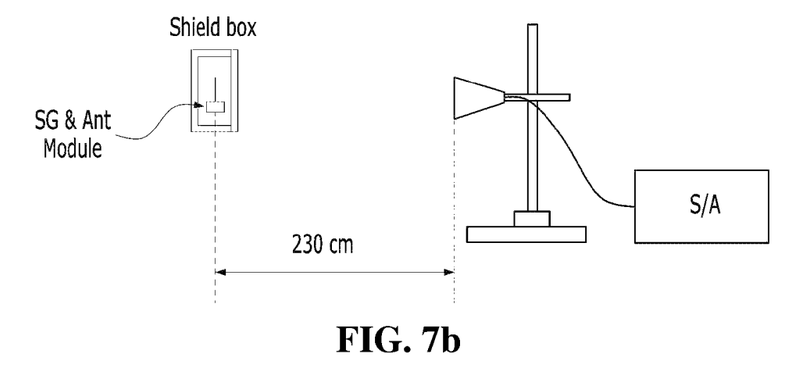

Further, as shown in FIGS. 6a and 6b, the measurements for the aluminum housing (upper photograph) and the plastic housing (lower photograph) are compared with each other.

In the measurement of the electromagnetic shielding ability, as shown in FIG. 7a, a reference value is first measured.

In a state where an end point of the antenna is maintained distant by at least 30 cm or more from the ground, as shown in FIG. 7a, the electromagnetic shielding ability is measured by a transmitting and receiving antenna to thus determine the reference value.

A λ monopole antenna module used as an RF signal generator is a module operating with a battery of 5 V and is a jig with VCO & PLL and amplifier built therein, and a length of an antenna is set to 75 mm. In this case, the reference value is measured in a state where no case or housing is provided.

So as to test the electromagnetic shielding effectiveness, as shown in FIG. 7b, λ monopole receiving antennas are located in the cases corresponding to the aluminum housing, the plastic housing, and the case 100 of the present invention with the metal coating layer 130, and a receiving antenna is located at a position set in advance on the outside.

The test results are obtained as listed in the following Table 2.

TABLE 2

Electromagnetic shielding effectiveness according to materials

| Material | Aluminum alloy | Plastic | Plastic + Cu plating | Plastic + Ag plating |
|---|---|---|---|---|
| Electromagnetic shielding (−dB) | −66 | 0 | −85 | −100 |
| Specific gravity | 2.7 | 1.34 | 1.39 | 1.40 |
| Weight (g) | 1.871 | 930 | 961 | 975 |
| Manufacturing method | Die casting | Injection | Injection + Plating | Injection + Plating |

Referring to Table 2, it can be appreciated that the mobile device case according to the present invention has half of weight compared with the aluminum housing, but has more improved electromagnetic shielding ability by about 1.3 (85/66)~1.5 times (100/66) than the aluminum housing. Also, it can be appreciated that the mobile device case according to the present invention has weight almost equal to the plastic housing, but has more improved electromagnetic shielding ability of 85~100 when compared with the plastic housing with the electromagnetic shielding ability of 0. Further, the strength increment through the metal coating layer is tested to obtain the results as listed in the following Table 3.

TABLE 3

Strength increment through metal coating layer

| Hardness(Hv) | Tensile strength (N/mm2) | Remarks |
|---|---|---|
| 500 | 1,700 | Specific gravity of alloy: |
| 600 | 2,150 | Ni-P |
| 700 | 2,500 | 7.9Ni-B 8.6Cr alloy 7.5 |
| 800 | 2,900 | |
| 900 | 3,300 | |

For the comparison, the tensile strength test of 3D printed ABS material (ABS specific gravity: 1.05) is carried out to thus obtain the results as listed in the following Table 4.

TABLE 4

Tensile strength test of 3D printed ABS materials

| | Tensile strength | |
|---|---|---|
| Thickness | Maximum stress (N/mm2) | Fracture stress (N/mm2) |
| 2 mm | 24.0175 | 23.0561 |
| 3 mm | 30.2571 | 29.0415 |
| 4 mm | 29.6829 | 25.9814 |
| 5 mm | 27.1333 | 26.7841 |

Referring to Tables 3 and 4, it can be appreciated that a metal alloy having high strength is coated on a plastic having low strength to remarkably increase the strength of the mobile device case. Further, it can be appreciated that if the hardness of the coated metal alloy is increased or the thickness of the metal coating layer becomes high, the strength of the mobile device case is more raised.

According to the present invention, the case for covering the inside and outside of the cellular phone or communication device is molded with the plastic and is then coated with the conductive high strength metal, so that the case is lightweight and has the strength of the metal, the improved electromagnetic shielding ability, and unique colors. Through the application of the injection molding and the metal plating, that is, the case according to the present invention can greatly reduce the manufacturing cost when compared with the existing aluminum housing and can greatly improve the reduction in the housing weight and thickness and the electromagnetic shielding characteristics thereof.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention. The foregoing description of the embodiments of the invention has been presented for the purpose of illustration; it is not intended to be exhaustive or to limit the invention to the precise forms disclosed. For example, the parts expressed in a singular form may be dispersedly provided, and in the same manner as above, the parts dispersed may be combined with each other.

It is therefore intended that the scope of the invention be limited not by this detailed description, but rather by the claims appended hereto, and it should be understood that the invention covers all the modifications, equivalents, and replacements within the idea and technical scope of the invention.

MODE FOR INVENTION

Hereinafter, the embodiment of the present invention has been suggested in the best mode of the present invention.

The invention claimed is:

1. A method for coating a mobile device case for accommodating or covering a substrate and an electronic element located on the substrate, the method comprising:
   providing a case frame made of a high molecular material including a resin, wherein the case frame includes:
      a cover accommodating or covering the substrate, and
      protrusions protruding from the cover to be extended adjacent to the electronic element;
   allowing the case frame to be subjected to hot air drying to remove a cleaning agent and water from a surface of the case frame;
   allowing the surface of the case frame dried with hot air to be subjected to a cold plasma treatment to introduce polar functional groups to enable plating on the surface of the case frame;
   allowing the surface of the case frame to be subjected to a catalystic treatment and an activation treatment for post-processes; and
   forming a metal coating layer on the surface of the case frame by electroless plating.

2. The method according to claim 1, further comprising, after the forming the metal coating layer, heating the case frame to a temperature less than a softening point of the high molecular material for 5 to 200 minutes to remove gas to improve an adhesive force between the case frame and the metal coating layer.

* * * * *